United States Patent
Krause

(10) Patent No.: US 10,649,038 B2
(45) Date of Patent: May 12, 2020

(54) OUTPUT MODULE, CONTROL SYSTEM AND METHOD FOR TESTING AN OUTPUT MODULE CONNECTED TO A COMPLEX LOAD

(71) Applicant: Siemens Industry, Inc., Alpharetta, GA (US)

(72) Inventor: Peter Krause, Johnson City, TN (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 77 days.

(21) Appl. No.: 15/957,269

(22) Filed: Apr. 19, 2018

(65) Prior Publication Data

US 2019/0324095 A1   Oct. 24, 2019

(51) Int. Cl.
*G01R 31/40*   (2020.01)

(52) U.S. Cl.
CPC .................... *G01R 31/40* (2013.01)

(58) Field of Classification Search
CPC .. G01R 31/40; G05B 19/0425; G05B 19/058; G05B 19/21163; G05B 19/1184
See application file for complete search history.

(56) References Cited

U.S. PATENT DOCUMENTS

| | | | | |
|---|---|---|---|---|
| 4,851,839 A * | 7/1989 | Reinke | ............... | H03M 1/1255 341/128 |
| 8,779,633 B2 * | 7/2014 | Hodges | .................... | H02H 3/12 307/126 |
| 9,906,117 B1 * | 2/2018 | Hoffman | ................ | G01R 31/27 |
| 2002/0162033 A1 | 10/2002 | Maxwell et al. | | |
| 2005/0234662 A1 * | 10/2005 | Niedzwiecki | .......... | G01R 27/04 702/60 |
| 2011/0251732 A1 * | 10/2011 | Schweitzer, III | ......... | H02J 3/12 700/297 |
| 2012/0283890 A1 * | 11/2012 | Fu | ............................ | H02J 3/14 700/295 |
| 2013/0218521 A1 | 8/2013 | Weddle et al. | | |
| 2013/0278224 A1 * | 10/2013 | Ofek | ..................... | H02M 7/219 320/137 |
| 2014/0088734 A1 * | 3/2014 | Narutani | ................ | G05B 19/05 700/28 |
| 2014/0327467 A1 * | 11/2014 | Diewald | ................ | G01R 31/40 324/764.01 |
| 2016/0274559 A1 * | 9/2016 | Plante | ................. | G05B 19/4184 |
| 2018/0261999 A1 * | 9/2018 | Shi | ........................ | G01R 31/027 |

FOREIGN PATENT DOCUMENTS

DE            10231797 A1     1/2004

* cited by examiner

*Primary Examiner* — Dominic E Hawkins

(57) ABSTRACT

An output module includes multiple outputs, each output having switches, wherein the switches are configured such that a load is connectable between the switches, and a calibration unit configured to disconnect the load from the switches for a calibration period, monitor a behavior of the load while disconnected, and store samples of the behavior of the load. Further aspects of the present disclosure relate to a control system and a method for testing an output module connected to a complex load.

14 Claims, 3 Drawing Sheets

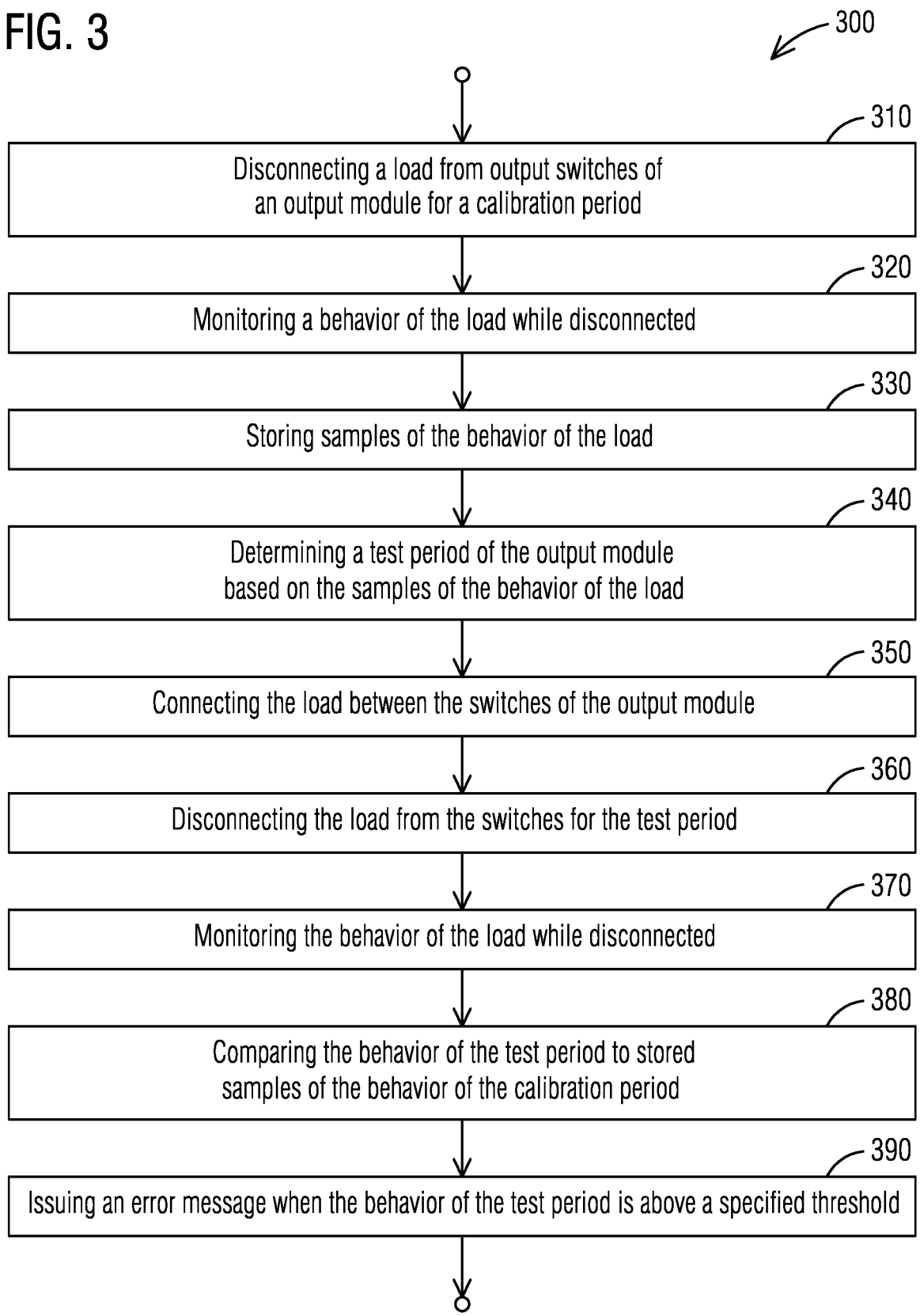

OUTPUT MODULE, CONTROL SYSTEM AND METHOD FOR TESTING AN OUTPUT MODULE CONNECTED TO A COMPLEX LOAD

BACKGROUND

1. Field

Aspects of the present disclosure generally relate to industrial and other automation systems, and more particularly to an output module, a control system and a method for testing an output module connected to a complex load.

2. Description of the Related Art

Industrial automation systems are used in different industrial fields to automatically perform a plurality of tasks, for example in a manufacturing process or an assembly line of production facility. Industrial automation systems comprise a plurality of interconnected components, such as for example sensors, actuators and control devices. The control devices can be for example programmable logic controllers (PLCs) for controlling and monitoring process parameters.

A programmable logic controller (PLC) is used to monitor input signals from a variety of input points (input sensors) which report events and conditions occurring in a controlled process. A control program is stored in a memory within the PLC to instruct the PLC what actions to take upon encountering particular input signals or conditions. In response to these input signals, the PLC derives and generates output signals which are transmitted via PLC output points to various output devices, such as actuators and relays, to control the process.

The input and output points referred to above are typically associated with input modules and output modules, respectively. Input modules and output modules are collectively referred to as I/O modules herein. Those skilled in the art alternatively refer to such I/O modules as I/O cards or I/O boards. The I/O modules are typically pluggable into respective slots located on a backplane board in the PLC.

I/O modules, specifically output modules, need to undergo cyclic tests to ensure the functionality of its outputs. When the output module is connected to a complex load, such a functionality test may also be complex and time consuming. Thus, there may exist a need for an improved functionality test for an output module when a complex load is coupled to the output module.

SUMMARY

Briefly described, aspects of the present disclosure relate to an output module, a control system and a method for testing an output module connected to a complex load.

A first aspect of the present disclosure provides an output module comprising a plurality of outputs, each output comprising switches, wherein the switches are configured such that a load is connectable between the switches; and a calibration unit configured to disconnect the load from the switches for a calibration period, monitor a behavior of the load while disconnected, and store samples of the behavior of the load.

A second aspect of the present disclosure provides a control system comprising a processor, a power supply, an input module, and an output module as described herein.

A third aspect of the present disclosure provides a method for calibrating and testing an output module comprising a plurality of digital outputs, each digital output comprising switches, wherein a load is connected between the switches, the method comprising disconnecting the load from the switches for a calibration period; monitoring a behavior of the load while disconnected; and storing samples of the behavior of the load.

BRIEF DESCRIPTION OF THE DRAWINGS

FIG. 3 illustrates a flow chart of a method for an output module in accordance with an exemplary embodiment of the present disclosure.

DETAILED DESCRIPTION

To facilitate an understanding of embodiments, principles, and features of the present invention, they are explained hereinafter with reference to implementation in illustrative embodiments. In particular, they are described in the context of industrial and other automation systems, and more particularly in the context of output modules and control systems, and methods for testing an output module connected to a complex load. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
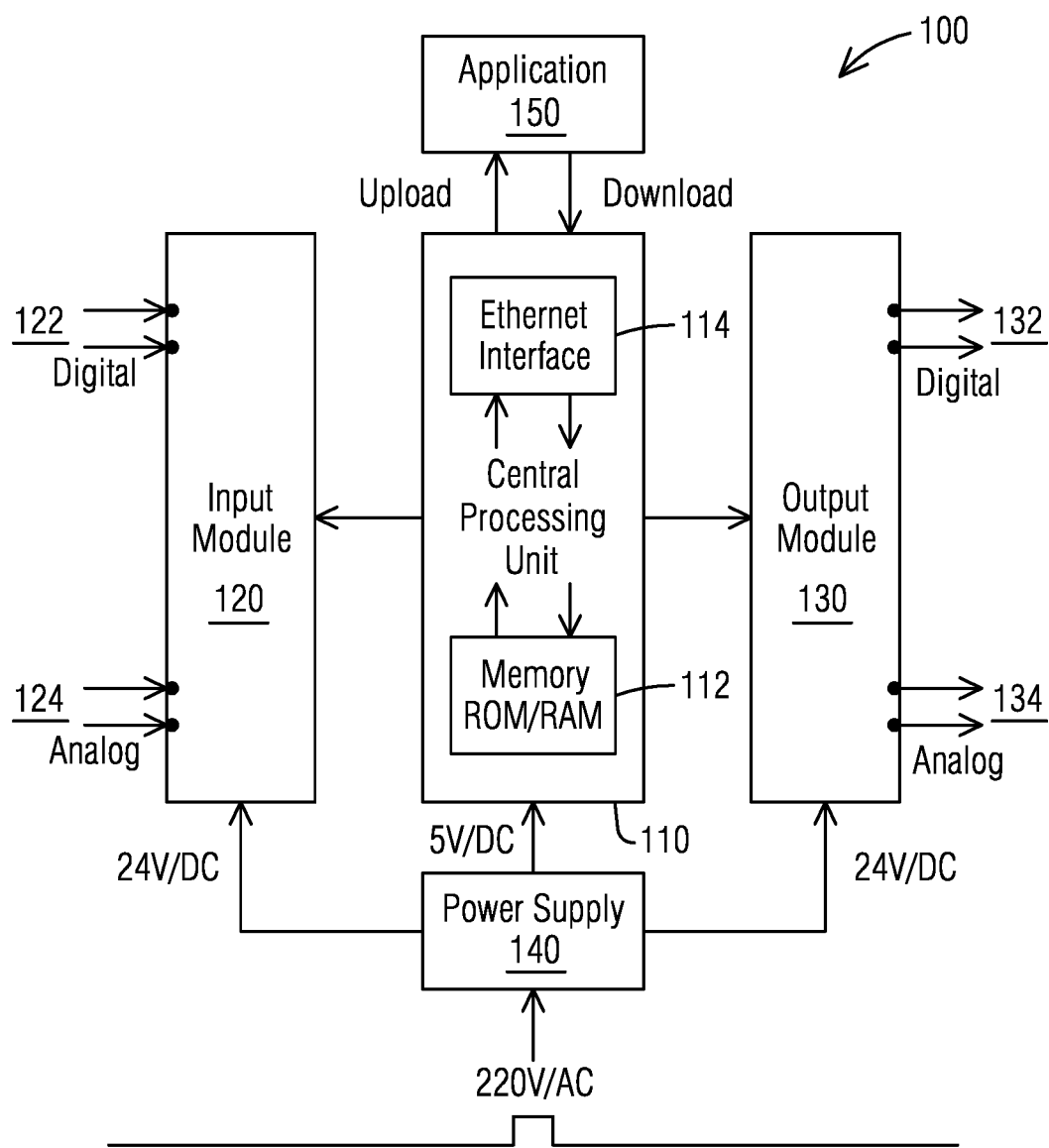
FIG. 1 illustrates a schematic diagram of a control system comprising multiple modules in accordance with an exemplary embodiment of the present disclosure.

FIG. 1 illustrates a schematic diagram of a control system 100 comprising multiple modules in accordance with an exemplary embodiment of the present disclosure.

In an exemplary embodiment, the control system 100 can be configured and/or comprises one or more programmable logic controllers (PLCs), which can comprise multiple modules. As noted before, PLCs are typically used in combination with automation systems in different industrial fields to automatically perform a plurality of tasks, for example in a manufacturing process or an assembly line of production facility. PLCs are control devices for controlling and monitoring process parameters.

With further reference to FIG. 1, the control system 100 comprises a central processing unit (CPU) 110, an input module 120 comprising digital and/or analog input points 122, 124, an output module 130 comprising digital and/or analog output points 132, 134 and a power supply 140 which supplies power, specifically direct current (DC) power, to the CPU 110, the input module 120 and the output module 130. The input/output modules 120, 130 typically operate with 24 volts (V) direct current (DC) and the CPU 110 typically operates with 5V DC. The CPU 120 can further comprise one or more memories (ROM and/or RAM) 112 and one or more Ethernet interface(s) 114.

The control system 100 monitors input signals from the input points 122, 124, such as input sensors, which report events and conditions occurring in a controlled process. An application 150, herein also referred to as control program, is downloaded and stored within the CPU 110 and comprises instructions what actions to take upon encountering particular input signals or conditions. In response to the input signals, the CPU 110 derives and generates output signals which are transmitted via the output points 132, 134 to various output devices, such as actuators and relays.

Further components of the control system 100 may include operator terminals which provide interfaces to the control system for monitoring, controlling and displaying information to an operator or end user. Operator terminals are also known as Human-Machine-Interface (HMI) devices which allow effective operation and control of the components and devices of the automation system from the human end, i.e. the operator or end user, while the components/devices of the automation system feed information back to the operator/end user. It should be noted that those skilled in the art are familiar with such control system and PLCs.

Figure 2:
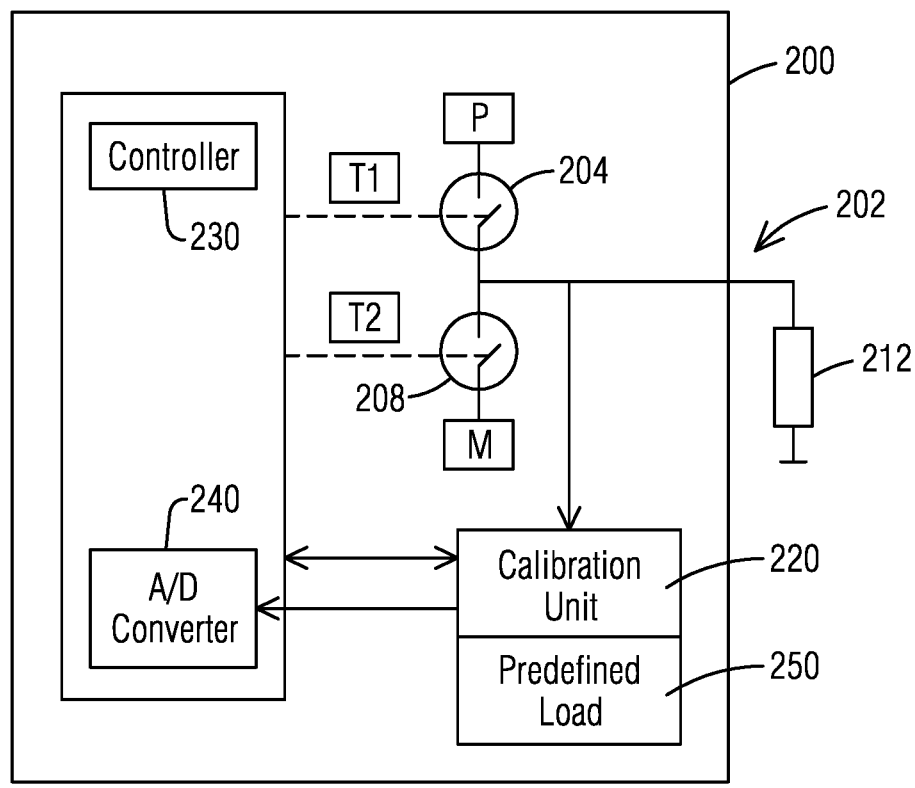
FIG. 2 illustrates a schematic diagram of an output module in accordance with an exemplary embodiment of the present disclosure.

FIG. 2 illustrates a schematic diagram of an output module 200 in accordance with an exemplary embodiment of the present disclosure. In an example, the output module 200 can be a component of control system 100, such as described with reference to FIG. 1, specifically output module 130 of FIG. 1.

As noted before, I/O modules, specifically output modules, need to undergo cyclic tests to ensure the functionality of its outputs. Such a test includes for example opening (releasing) switches of the output for a short, parameterized amount of time and reading back specific values or levels, such as for example voltage levels. These values or levels are then compared with predefined value(s) or level(s), wherein an error message is created if a behavior of the output module is not within a specified window and/or below/above specified threshold(s). However, when a complex load, such as capacitive and/or inductive load, is connected to one or more outputs of the output module, the behavior of the values or levels to be monitored and compared depend on the complex load itself. This means that the values or levels at the output(s) will change slowly because the complex load needs time to be discharged, and the higher the capacitive load is the more time is needed for a significant change of the values or levels to be visible.

With further reference to FIG. 2, the exemplary output module 200 comprises a plurality of outputs 202, which can be digital and/or analog outputs. Each output 202 comprises one or more switches, which are typically semiconductor switches. Output 202 comprises first semiconductor switch 204 and second semiconductor switch 208. The switches 204, 208 are configured such that a load 212 is connectable between the switches 204, 208. The switches 204, 208 are herein also referred to P- and M-switches, wherein the module 200 can switch between P and M such that either both switches are closed or open or such that one switch is closed, and one switch is open. The output module 200 further comprises a controller 230 which controls the output module including controlling the P- and M-switches by transmitting corresponding signals T1, T2 for opening or closing the switches 204, 208. The controller 230 can be for example a microcontroller, operating typically at about 1.3V DC.

In an exemplary embodiment, the output module 200 further comprises a calibration unit 220 for calibrating and/or testing the output module 200 when coupled to the load 212, which is specifically a complex load. The calibration unit 220 is configured as software or hardware or a combination of soft- and hardware.

The complex load 212 as used herein comprises capacitive and/or inductive characteristics. Examples for the complex load 212 include an RLC circuit load comprising a resistor (R), an inductor (L) and a capacitor (C), or solenoid valves with primarily capacitive characteristics.

The calibration unit 220 is configured to perform a method for calibrating and/or testing the output module 200 when the complex load 212, such as a solenoid valve, is coupled to the output 202. In an exemplary embodiment, the described method comprises two stages which are a calibration stage and a regular test stage. To perform certain steps of the method, the calibration unit 220 is in communication with the controller 230 of the output module 200. The method for calibrating and/or testing the output module 200 will be described in detail with reference to FIG. 3.

In a further exemplary embodiment, the output module 200 comprises an analog-to-digital (A/D) converter 240 in communication with the calibration unit 220, wherein the A/D converter 240 is configured to receive analog signals of the samples of the behavior of the load 212 (for example voltage levels or values), and to convert the analog signals into digital signals for further processing, such as for example storing. The A/D converter 240 can be integrated in the controller 230.

The calibration unit 220 can be further configured to change or create a level (for example a voltage level) of the load 212 which does not exceed a specified range of the controller 230, specifically a specified range of an input voltage of the controller 230. Thus, the calibration unit 220 may comprise a level changer and/or amplifier. As previously noted, the controller 230, when designed as microcontroller, typically operates in a range of about 1.3V DC, wherein the sampled voltage levels or values of the load 212 may need to be changed accordingly so that a functionality of the controller 230 is not compromised.

Further, the calibration unit 220 may comprise a predefined load 250 which can be used to decrease a time needed for a complete discharge of the complex load 212, for example to achieve a shorter discharge time. In such a case, the predefined load 250 may be 'added' to the complex load 212 during a discharge for a faster discharge.

FIG. 3 illustrates a flow chart of a method 300 for an output module 200 in accordance with an exemplary embodiment of the present disclosure. The method 300 provided herewith refers to the components and elements as described before with reference to FIG. 1 and FIG. 2.

As noted before, the output module 200, specifically the calibration unit 220, is configured to perform a method for calibrating and/or testing the output module 200 when the complex load 212, such as a solenoid valve, is coupled to the output 202. In an exemplary embodiment, the described method comprises two stages which are a calibration stage and a regular test stage.

For a first stage, the calibration stage, the method comprises disconnecting 310 the load 212 from the switches 204, 208, monitoring 320 a behavior of the load 212 while disconnected, and storing 330 samples of the behavior of the load 212. In an embodiment, the calibration unit 220 is configured to disconnect the complex load 212, to monitor a behavior of the load 212 while disconnected, and to store samples of the behavior of the load 212. For disconnecting 310 the load 212, the calibration unit 220 sends a corresponding signal to the controller 230 which in turn disconnects the load 212, i.e. opens both switches 204, 208 via signals T1 and T2.

As soon as the load 212 is disconnected, the load 212 begins discharging, for example under predefined conditions, which will take a certain amount of time depending on the load 212 itself. During the discharging, the calibration unit 220 is configured to monitor and store samples of a complete discharge of the complex load 212. The calibration unit 220 monitors and stores for example a discharge curve and samples of the discharge curve. Samples may include voltage levels or values and the amount of time needed to reach the voltage levels or values. For example, a sample may include that a voltage level of 3V has been reached after one minute or that a voltage level of 0V has been reached after three minutes.

When the discharge of the load 212 is completed (for example the voltage level is 0V), a behavior or "fingerprint" of the load 212 has been obtained and stored. The behavior or "fingerprint" of the load 212 shows when a significant change of the sampled values or levels occurs. For example, a significant change of a voltage level may occur after one minute after disconnecting, wherein such a time of a significant change can be used for a regular output test of the module 200 later (instead of the period needed for a complete discharge). A significant change can be for example when 50% of the discharge of the load 212 has been reached. This step includes determining 340 a test period for the output module 200 based on the samples of the behavior of the load 212. The test period is shorter than a calibration period needed within the calibration stage of the output module 200, e.g. a complete discharge of the load 212.

The discharge curve and/or samples are stored permanently in a non-volatile memory. The memory can be part of the output module 200 or the samples may be stored remotely, for example in a memory of the CPU 110 of the control system 100 as described with reference to FIG. 1. In a further exemplary embodiment, the discharge curve and/or samples may be used for parameterization. For example, one or more parametric equations describing the discharge curve may be determined and stored. Thus, only the equation(s) need to be stored and not the complete discharge curve with samples.

The calibration stage can be performed when the output module 200 and the load 212 are installed but not yet in operation, i.e. during an installation phase of the output module 200. The calibration stage can be further performed in large intervals, for example once a year, to verify that the obtained data and samples are still correct.

For a second stage, the regular test stage, the output module 200 is in operation, and is for example an operating part of the control system 100 (see FIG. 1). The complex load 212 is coupled between the switches 204, 208 (see step 350). In predefined intervals, the output module 200 needs to undergo cyclic tests to ensure the output 202 is working properly. For such a regular functionality test, the calibration unit 212 is configured to disconnect the load 212 from the switches 204, 208 (see step 360), and to monitor a behavior of the load 212, for example voltage levels or values and time (see step 370).

Since the behavior or "fingerprint" of the load 212, including a test period for an appropriate time for an output test, which can be for example when a significant change of the sampled values or levels occurs (for example 50% of the discharge has been reached), has previously been obtained and stored (during the calibration stage), the test is only conducted for the test period previously determined. This means that the complex load 212 does not need to be discharged completely, but only a specified amount of time, wherein the obtained data and samples are then compared to the stored samples and/or discharge curve of the behavior (see step 380). Thus, when regular tests of the module 200 are performed, the tests can be conducted for a shorter period (the test period) than the time needed for calibration period which includes the complete discharge.

In a further exemplary embodiment, the calibration unit 220 is configured to issue an error or warning message when the behavior of the load 212 is outside a predefined window for levels or values or above/below a predefined threshold (see step 390). For example, when the test period is completed and a voltage level of the load 212 does not lie within a predefined voltage level window, the calibration unit 220 issues an error or warning message (to an operator or user) indicating that the output 202 of the module 200 is faulty. It should be appreciated that the described method 300 can comprise more steps, or some steps can be repeated multiple times, or some steps are optional. For example, regular tests can be performed as often as required, wherein calibration tests may only be performed once for the module.

It should be further noted that the provided components and functionalities may not only be applied to an output module of a control system as described herein, but to many other modules or devices configured to output analog and/or digital signals, and coupled to a complex DC operated load.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

The invention claimed is:

1. An output module comprising:
a plurality of outputs, each output comprising switches, wherein the switches are configured such that a load is connectable between the switches, wherein the load comprises capacitive and/or inductive characteristics; and
a calibration unit configured to
disconnect the load from the switches for a calibration period,
monitor a behavior of the load while disconnected, and store samples of the behavior of the load,
wherein a discharge of the load is monitored while disconnected from the switches, and
wherein the samples include a discharge curve of the load.

2. The output module of claim 1, wherein the load comprises a solenoid valve or an RLC circuit load.

3. The output module of claim 1, wherein the calibration unit is configured to monitor a voltage level of the load.

4. The output module of claim 1, wherein the samples of the behavior of the load are stored in a non-volatile memory.

5. The output module of claim 1, further comprising:
a controller and an analog-to-digital (A/D) converter in communication with the calibration unit, wherein the A/D converter is configured to receive analog signals of the samples of the behavior of the load and to convert the analog signals into digital signals.

6. The output module of claim 1, wherein the calibration unit comprises a predefined load for decreasing a discharge time of the load.

7. A control system comprising:
a processor,
a power supply,
an input module, and
an output module comprising:
a plurality of outputs, each output comprising switches, wherein the switches are configured such that a load is connectable between the switches, wherein the load comprises capacitive and/or inductive characteristics; and a calibration unit configured to
disconnect the load from the switches for a calibration period,
monitor a behavior of the load while disconnected, and store samples of the behavior of the load,
wherein a discharge of the load is monitored while disconnected from the switches, and
wherein the samples include a discharge curve of the load.

8. The control system of claim 7, configured as programmable logic controller (PLC).

9. A method for calibrating and testing an output module comprising a plurality of digital outputs, each digital output comprising switches, wherein a load is connected between the switches, the load comprising capacitive and/or inductive characteristics, the method comprising:
disconnecting the load from the switches for a calibration period;
monitoring a behavior of the load while disconnected; and
storing samples of the behavior of the load,
wherein monitoring the behavior of the load comprises monitoring a discharge of the load while disconnected from the switches, and
wherein the samples include a discharge curve of the load.

10. The method of claim 9, further comprising:
decreasing a discharge time of the load by adding a predefined load.

11. The method of claim 9, further comprising:
determining a test period based on stored samples of the behavior of the load, wherein the test period is less than the calibration period.

12. The method of claim 11, wherein a change in the behavior of the load occurs during the test period.

13. The method of claim 11, further comprising:
connecting the load between the switches,
disconnecting the load from the switches for the test period,
monitoring the behavior of the load while disconnected, and
comparing the behavior of the load of the test period to previously stored samples of the behavior of the load during the calibration period.

14. The method of claim 13, further comprising:
issuing an error message when the behavior of the load of the test period is outside a predefined window or above a predefined threshold.

* * * * *